(12) United States Patent
Hsue et al.

(10) Patent No.: US 6,358,792 B1
(45) Date of Patent: Mar. 19, 2002

(54) METHOD FOR FABRICATING METAL CAPACITOR

(75) Inventors: Chen-Chiu Hsue, Hsinchu; Shyh-Dar Lee, Hsinchu Hsien, both of (TW)

(73) Assignee: Silicon Integrated Systems Corp. (TW)

( * ) Notice: Subject to any disclaimer, the term of this patent is extended or adjusted under 35 U.S.C. 154(b) by 0 days.

(21) Appl. No.: 09/881,101

(22) Filed: Jun. 15, 2001

(51) Int. Cl.[7] ............................ H01L 21/8242
(52) U.S. Cl. ..................... 438/250; 438/393
(58) Field of Search .................. 438/238–240, 438/350–356, 390–396, 3

(56) References Cited

U.S. PATENT DOCUMENTS

| | | |
|---|---|---|
| 5,086,370 A | 2/1992 | Yasaitis |
| 5,479,316 A | 12/1995 | Smrtic et al. |
| 5,607,873 A * | 3/1997 | Chen et al. |
| 6,291,307 B1 * | 9/2001 | Chu et al. .................. 438/393 |

* cited by examiner

*Primary Examiner*—Jey Tsai

(57) ABSTRACT

The present invention provides a method for fabricating a metal capacitor. A first level metal layer is formed on a substrate. Then, the first level metal layer is patterned to concurrently form a first metal line and a second metal line. The second metal line defines a metal capacitor region and is used as a lower electrode of the metal capacitor. Then, an insulating layer is conformably formed on the substrate, the first metal line, and the second metal line. A first intermetal dielectric layer is formed on the insulating layer. Then, the first intermetal dielectric layer is subjected to planarization treatment such that the planarization treatment finally exposes the insulating layer. Finally, a third metal line is formed on the insulating layer in the metal capacitor region such that the third metal line is used as the upper electrode of the metal capacitor. Since the lower electrode and the interconnect metal line can be in-situ (concurrently) formed, one mask can be omitted compared with the conventional method, and production costs can be reduced.

12 Claims, 5 Drawing Sheets

METHOD FOR FABRICATING METAL CAPACITOR

BACKGROUND OF THE INVENTION

1. Field of the Invention

The present invention relates to a method for fabricating a metal capacitor, and more particularly to a method for fabricating a metal capacitor in which the lower electrodes are concurrently formed with an interconnect metal.

2. Description of the Prior Art

In conventional VLSI (very large scale integrated) capacitor process, capacitors are of the so-called "double poly" type. That is, the upper and lower electrodes are formed of polysilicon. However, since the polysilicon layers have depletion regions, which induces parasitic capacitance, they cannot meet the requirement of low voltage coefficient of capacitance.

In recent years, the "double poly" type of capacitor has gradually been replaced by a metal capacitor, in which the upper and lower electrodes are formed of metal.

For example, U.S. Pat. No. 5,479,316 discloses a method for making a metal capacitor, in which two metal layers serve as the upper and lower electrodes of the capacitor.

In U.S. Pat. No. 5,086,370, a method for making a metal capacitor having a low voltage coefficient is disclosed. The lower electrode is a polysilicon layer clad with a $TiSi_2$ thin film, and the upper electrode is a TiN thin film with a polysilicon layer formed thereon. Thus, the depletion region is decreased, and,the capacitor has a low voltage coefficient.

However, in the above-mentioned cases, one process is complicated, and the other process requires additional metal layers to serve as the upper/lower electrodes, wasting space and material.

Refer to FIGS. 1a to 1f, which are cross-sectional views illustrating the process flow of fabricating a metal capacitor in an intermetal dielectric layer according to conventional process. Referring to FIG. 1a, a semiconductor substrate 100 including a MOS transistor (not shown) is provided. A plurality of first level metal lines 120 and 121 are formed on the substrate 100, and a first intermetal dielectric layer 110 is formed on the substrate 100 and the metal lines 120 and 121. A first resist pattern 140 is formed on the first intermetal dielectric layer 110. The first intermetal dielectric layer 110 is then patterned by photolithography and etching using the first resist pattern 140 as a mask to form a via hole. Metal is then filled into the via hole to form a first plug 150, and the first resist layer 140 is removed.

Next, referring to FIG. 1b, a metal layer 160, an insulating layer 170, and a metal layer 180 are successively formed on the entire surface of the first intermetal dielectric layer 110 and the first plug 150. A second resist pattern 190 is formed on the metal layer 180. The second resist pattern 190 defines a region for forming a metal capacitor in the future, which is called a capacitor region 130. Then, the metal layer 160, the insulating layer 170, and the metal layer 180 are patterned by photolithography and etching using the second resist pattern 190 as a mask to define a metal capacitor 200 which includes a lower electrode 160', an insulating layer 170', and an upper electrode 180' as shown in FIG. 1c.

Next, referring to FIG. 1d, a second intermetal dielectric layer 210 is formed on the metal capacitor 200 and the first intermetal dielectric layer 110.

Next, referring to FIG. 1e, a third resist pattern 220 is formed on the second intermetal dielectric layer 210. The second intermetal dielectric layer 210 is then patterned by photolithography and etching by using the third resist pattern 220 as a mask to form a via hole in the capacitor region 130 reaching the upper electrode 180' and a via hole reaching first level metal line 120, which are then filled with metal to form a second plug 230 and a third plug 240.

Finally, referring to FIG. 1f, second level metal lines 250 and 251 are formed on the plugs 230 and 240 respectively for electrical connection.

The conventional method for fabricating a metal capacitor in an intermetal dielectric layer has the following disadvantages:

(1) Two masks are needed to fabricate a metal capacitor. That is to say, one mask is needed when the plug 150 is defined and the other mask is needed when the metal capacitor is patterned. Thus, costs are high.

(2) Since the cross-sectional area of the plug 150 is small, when the plug 150 is defined, etching is very difficult to control, complicating the process.

(3) When the plugs 230 and 240 are concurrently defined, since the etching heights for the two plugs differ a lot, etching is difficult to conduct, complicating the process.

(4) Since the metal layer 160, the insulating layer 170, and the metal layer 180 for forming the metal capacitor are formed on the entire surface, production costs are very high.

(5) When the metal layer 160, the insulating layer 170, and the metal layer 180 are etched to form the metal capacitor, it is very easy to cause damage on the edge portion of the metal capacitor. Thus, yield is decreased.

SUMMARY OF THE INVENTION

The object of the present invention is to solve the above-mentioned problems and to provide a method for fabricating a metal capacitor, which is simple, has decreased production costs, and increased yield.

To achieve the above-mentioned object, the method for fabricating a metal capacitor according to the present invention includes the following sequential steps. A first level metal layer is formed on a substrate. The first level metal layer is patterned to concurrently form a first metal line and a second metal line, wherein the second metal line defines a metal capacitor region and is used as a lower electrode of the metal capacitor. An insulating layer is formed conformably on the substrate, the first metal line, and the second metal line. A first intermetal dielectric layer is formed on the insulating layer. The first intermetal dielectric layer is subjected to planarization treatment such that the planarization treatment ends up to the insulating layer. A third metal line is formed on the insulating layer in the metal capacitor region such that the third metal line is used as an upper electrode of the metal capacitor.

After the upper electrode is formed, the method for fabricating the metal capacitor according to the present invention can further include the following steps. A second intermetal dielectric layer is formed on the upper electrode, the insulating layer, and the first intermetal dielectric layer. The second intermetal dielectric layer is patterned to form a first via hole reaching the first metal line and a second via hole reaching the upper electrode. Metal is filled into the first and the second via holes to form a first and a second plugs respectively. A second level metal layer is formed on the second intermetal dielectric layer, the first plug, and the second plug. The second level metal layer is patterned to form a fourth metal line on the first plug and a fifth metal line on the second plug.

The main difference between the method of the present invention and the conventional method resides in the fact that, in the present invention, the lower electrode and an interconnect metal line are located at the same level. That is to say, the lower electrode and the interconnect metal line can be in-situ (concurrently) formed. Thus, one mask can be omitted compared with the conventional method, and a step of photolithography and etching can be omitted.

In the present invention, production costs are decreased, process complexity is decreased, yield is enhanced, and the object of minaturizing integrated circuits is achieved.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Refer to FIGS. 2 to 9, which are cross-sectional views illustrating the process flow of fabricating the metal capacitor in an intermetal dielectric layer according to a preferred embodiment of the present invention.

Figure 1A:
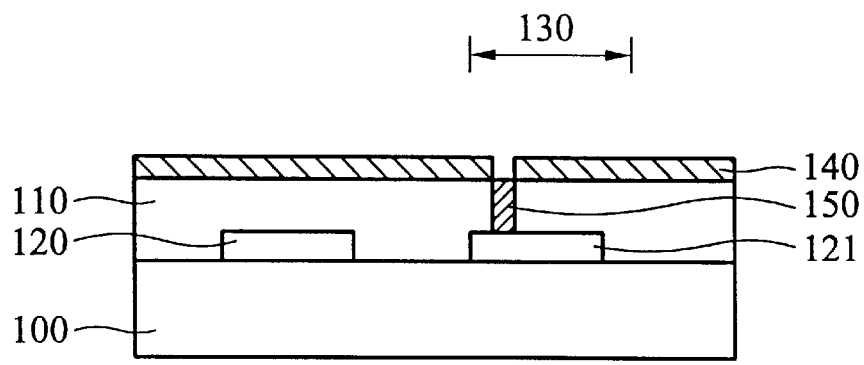
FIGS. 1a to 1f are cross-sectional views illustrating the process flow of fabricating a metal capacitor according to a conventional method.
Figure 1B:
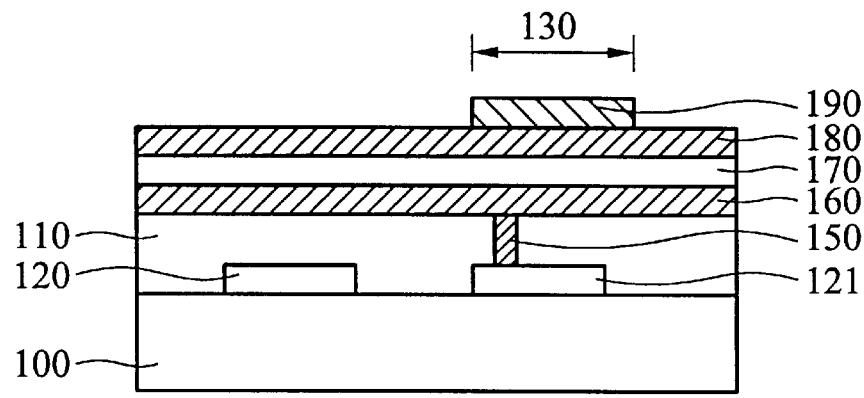
Figure 1C:
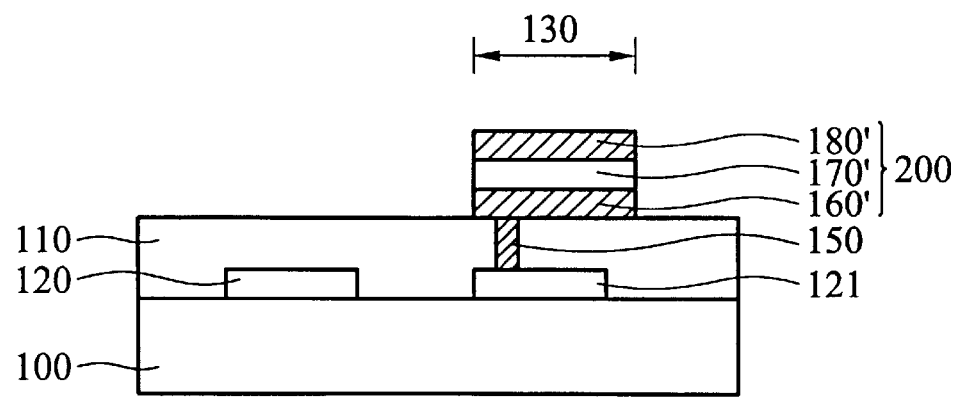
Figure 1D:
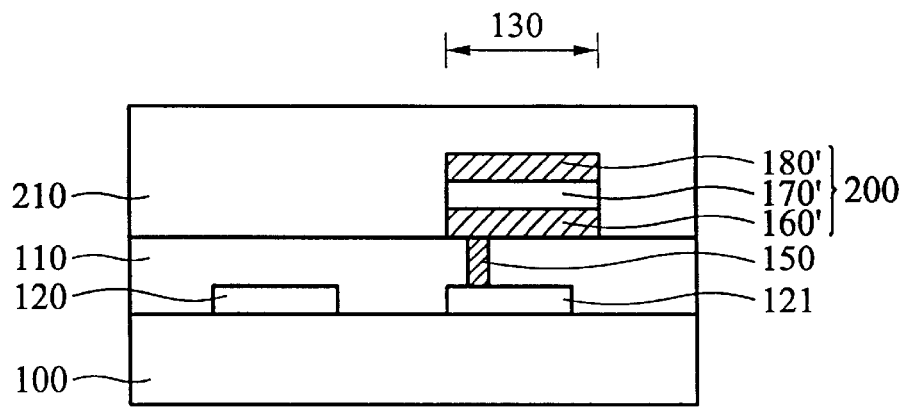
Figure 1E:
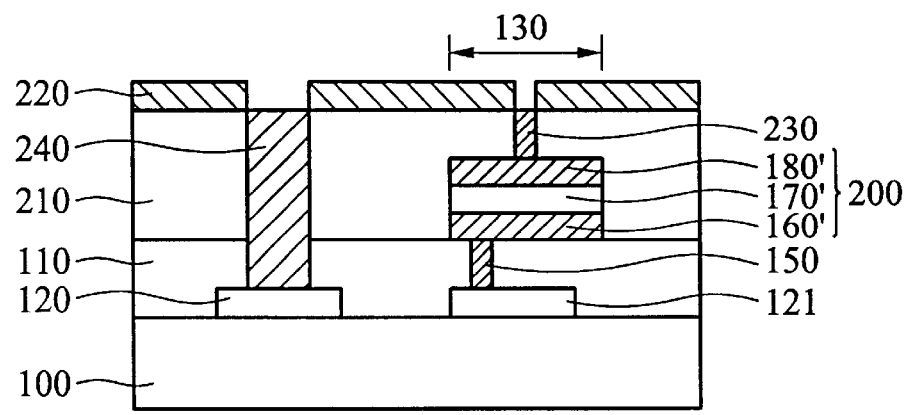
Figure 1F:
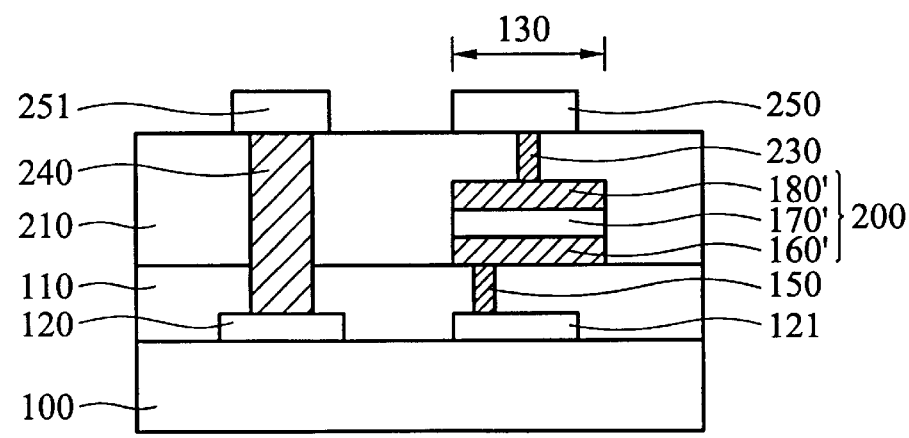
Figure 2:
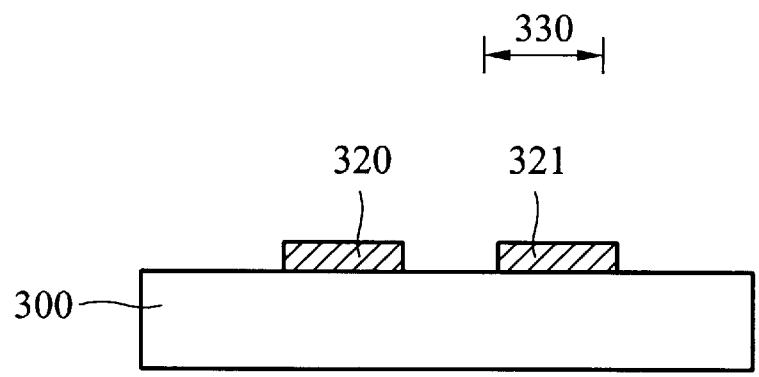
FIGS. 2 to 9 are cross-sectional views illustrating the process flow of fabricating a metal capacitor according to a preferred embodiment of the present invention.

Referring to FIG. 2, a first level metal layer (not shown) is formed on a substrate 300. Then, the first level metal layer is patterned to concurrently form a first metal line 320 and a second metal line 321. The second metal line 321 defines a metal capacitor region 330 and is used as a lower electrode of a metal capacitor. The first and second metal lines 320 and 321 can be made of aluminum, copper, or an aluminum alloy having a thickness of 4000 Å to 6000 Å.

Figure 3:
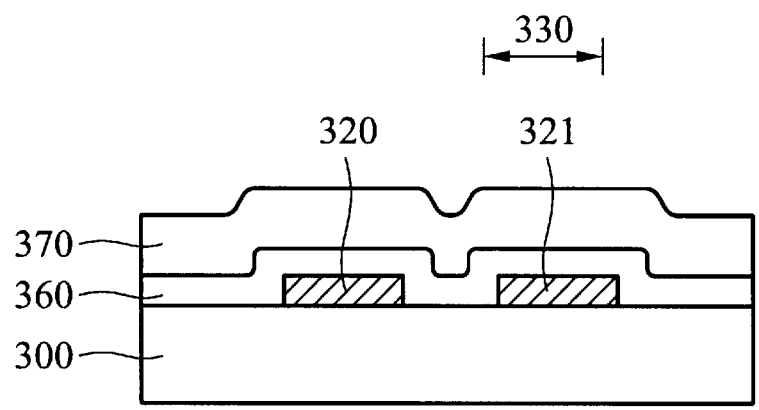

Subsequently, referring to FIG. 3, an insulating layer 360 is formed conformably on the substrate 300, the first metal line 320, and the second metal line 321. Then, a first intermetal dielectric layer 370 is formed on the insulating layer 360. The insulating layer 360 can be made of a material selected from the group consisting of SiN, SiON, SiC, $TaO_2$, $TiO_2$, $ZrO_2$, $HfO_2$, and $Al_2O_3$ having a thickness of 100 Å to 1500 Å formed by chemical vapor deposition (CVD). The first intermetal dielectric layer 370 can be a silicon oxide layer having a thickness of 4000 Å to 10000 Å formed by CVD, preferably HDPCVD (high density plasma CVD).

Figure 4:
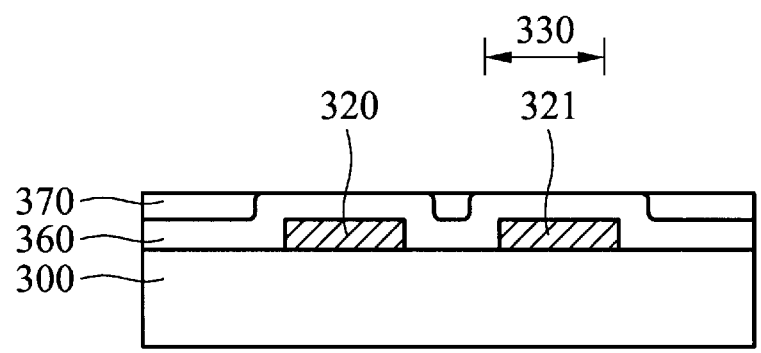

Subsequently, referring to FIG. 4, the first intermetal dielectric layer 370 is subjected to planarization treatment such that the planarization treatment ends up to the insulating layer 360. The planarization treatment can be chemical mechanical polishing (CMP).

Figure 5:
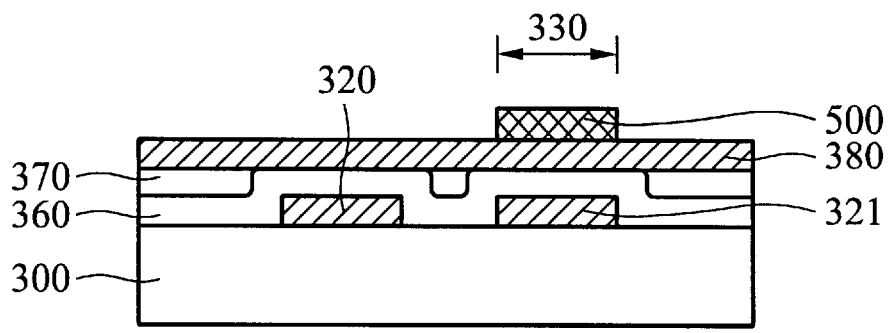

Subsequently, referring to FIG. 5, a metal layer 380 is formed on the first intermetal dielectric layer 370 and the insulating layer 360. The metal layer 380 can be Ti, TiN, Ta, TaN, Al, or AlCu having a thickness of 100 Å to 2500 Å. Then, a first photoresist pattern 500 is formed on the metal layer 380 in the metal capacitor region 330.

Figure 6:
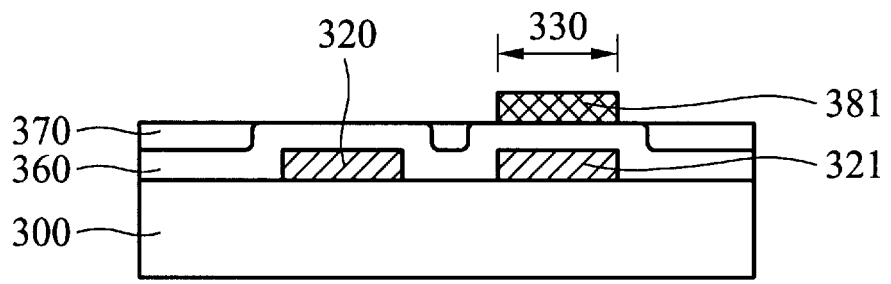

Subsequently, referring to FIG. 6, the metal layer 380 is patterned by photolithography and etching using the first photoresist pattern 500 as a mask to form a third metal line 381 on the insulating layer 360, such that the third metal line 381 is used as an upper electrode of a metal capacitor. Thus, the metal capacitor of the present invention is formed, which is constituted by the second metal line 321 (serving as the lower electrode), the insulating layer 360, and the third metal line 381 (serving as the upper electrode).

Figure 7:
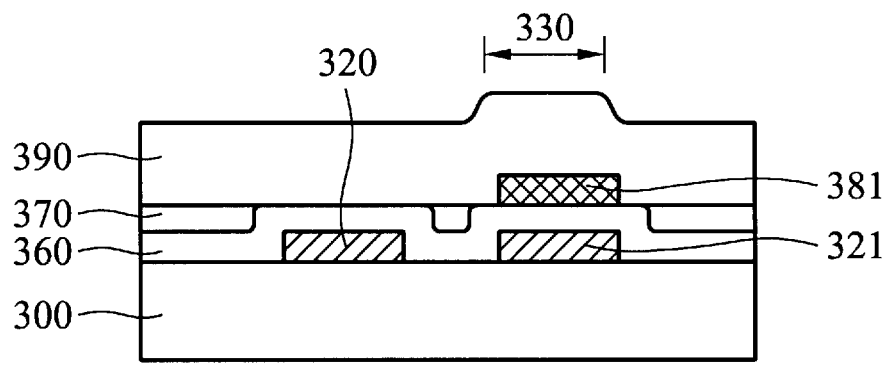

Subsequently, referring to FIG. 7, a second intermetal dielectric layer 390 is formed on the upper electrode 381, the insulating layer 360, and the first intermetal dielectric layer 370. The second intermetal dielectric layer 390 can be a silicon oxide layer having a thickness of 4000 Å to 10000 Å formed by CVD, preferably PECVD (plasma-enhanced CVD).

Figure 8:
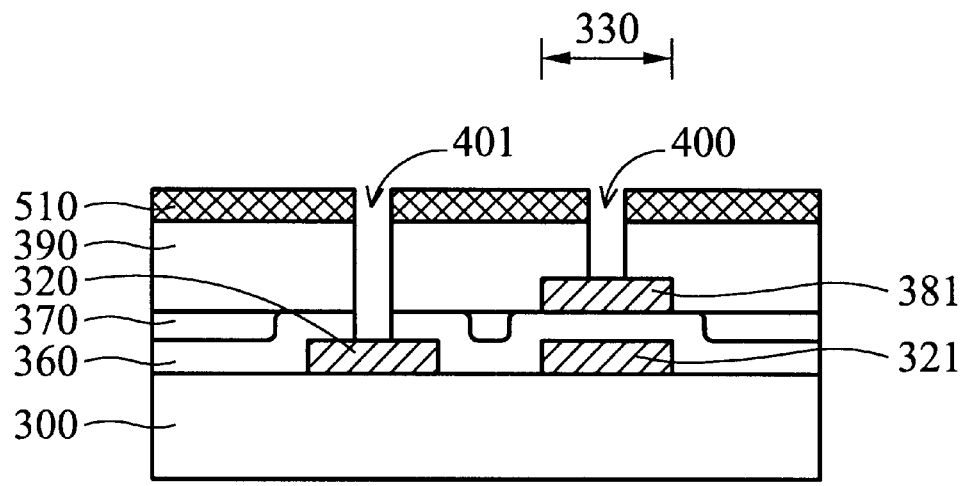

Subsequently, referring to FIG. 8, the second intermetal dielectric layer 390 can be subjected to CMP treatment to planarize the surface of the second intermetal dielectric layer 390. Then, a second photoresist pattern 510 is formed on the second intermetal dielectric layer 390. Then, the second intermetal dielectric layer 390 is patterned by photolithography and etching using the second photoresist pattern 510 as a mask to form a first via hole 410 reaching the first metal line 320 and a second via hole 400 reaching the upper electrode 381.

Figure 9:
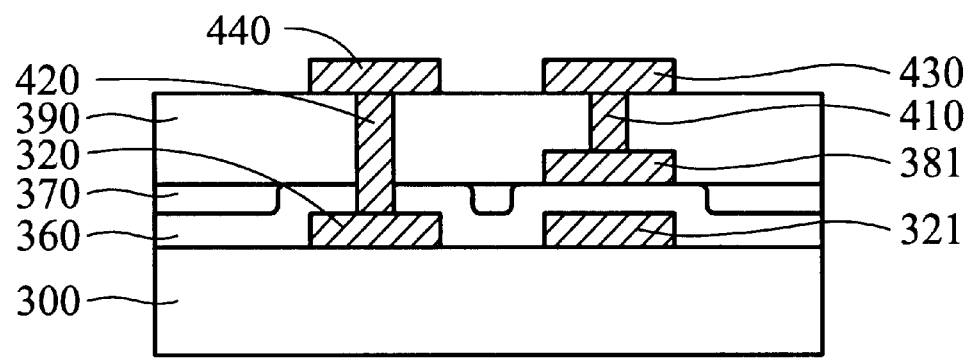

Subsequently, referring to FIG. 9, metal is filled into the first and the second via holes 401 and 400 to form first and second plugs 420 and 410 respectively. For example, tungsten can be directly filled into the first and the second via holes 401 and 400. Or, alternatively, a barrier layer (not shown) can be first formed on the first and the second via holes 401 and 400. Then, tungsten is deposited on the barrier layer to fill tungsten into the first and the second via holes 401 and 400. The barrier layer can be Ti/TiN or TiW formed by sputtering. Then, a second level metal layer (not shown) is formed on the second intermetal dielectric layer 390, the first plug 420, is and the second plug 410. Then, the second level metal layer is patterned to form a fourth metal line 440 on the first plug 420 and a fifth metal line 430 on the second plug 410 for electrical connection. The fourth and fifth metal lines can be made of aluminum, copper, or an aluminum alloy having a thickness of 4000 Å to 6000 Å.

The main difference between the method of the present invention and the conventional method resides in the fact that in the present invention, the lower electrode 321 and a interconnect metal line 320 are located at the same level. That is to say, the lower electrode 321 and the interconnect metal line 320 can be in-situ (concurrently) formed. Thus, one mask can be omitted compared with the conventional method, and thus a step of photolithography and etching can be omitted.

In conclusion, the method for fabricating a metal capacitor according to the present invention has many advantages:

(1) Only one mask is needed to fabricate a metal capacitor. That is to say, one mask is needed when the upper electrode 381 is defined. The lower electrode 321 and the interconnect metal line 320 is in-situ (concurrently) formed. Thus, one mask is omitted compared with the conventional method. Production costs are reduced.

(2) Since the lower electrode 321 and the interconnect metal line 321 are the same, it is easier to design circuits, and the volume of integrated circuits is conserved. In addition, there is no need to adjust the thickness of the dielectric layer and the location of the interconnect for the additional capacitor as in the conventional method.

(3) When the first and second via holes 401 and 400 are defined, since the etching heights for these two via holes differ a little, etching is easy to conduct, which decreases the complexity of the process.

(4) The method of the present invention can effectively protect the upper and lower electrodes from the effects of subsequent etching. Thus, the edge portion of the metal capacitor will not change, and the electrode surface is easily controlled.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a metal capacitor, comprising:

forming a first level metal layer on a substrate;

patterning the first level metal layer to concurrently form a first metal line and a second metal line, wherein the second metal line defines a metal capacitor region and is used as a lower electrode of the metal capacitor;

forming conformably an insulating layer on the substrate, the first metal line, and the second metal line;

forming a first intermetal dielectric layer on the insulating layer;

subjecting the first intermetal dielectric layer to planarization treatment such that the planarization treatment ends up to the insulating layer; and forming a third metal line on the insulating layer in the metal capacitor region such that the third metal line is used as an upper electrode of the metal capacitor.

2. The method as claimed in claim 1, further comprising, after the upper electrode is formed, the following steps:

forming a second intermetal dielectric layer on the upper electrode, the insulating layer, and the first intermetal dielectric layer;

patterning the second intermetal dielectric layer to form a first via hole reaching the first metal line and a second via hole reaching the upper electrode;

filling metal into the first and the second via holes to form first and second plugs respectively; and forming a second level metal layer on the second intermetal dielectric layer, the first plug, and the second plug; and patterning the second level metal layer to form a fourth metal line on the first plug and a fifth metal line on the second plug.

3. The method as claimed in claim 1, wherein the insulating layer is made of a material selected from the group consisting of SiN, SiON, SiC, $TaO_2$, $TiO_2$, $ZrO_2$, $HfO_2$, and $Al_2O_3$ formed by chemical vapor deposition (CVD).

4. The method as claimed in claim 1, wherein the first intermetal dielectric layer is a silicon oxide layer formed by CVD.

5. The method as claimed in claim 1, wherein the second intermetal dielectric layer is a silicon oxide layer formed by CVD.

6. The method as claimed in claim 1, wherein the first and second metal lines are made of aluminum, copper, or an aluminum alloy.

7. The method as claimed in claim 1, wherein the upper electrode is made of Ti, TiN, Ta, TaN, Al, or AlCu.

8. The method as claimed in claim 1, wherein the planarization treatment is chemical mechanical polishing (CMP).

9. The method as claimed in claim 2, wherein the fourth and fifth metal lines are made of aluminum, copper, or an aluminum alloy.

10. The method as claimed in claim 2, wherein the step of filling metal into the first and the second via holes to form first and second plugs respectively is performed by:

filling tungsten into the first and the second via holes.

11. The method as claimed in claim 10, wherein the step of filling metal into the first and second via holes to form first and second plugs respectively is performed by:

forming a barrier layer on the first and the second via holes; and depositing tungsten on the barrier layer to fill tungsten into the first and the second via holes.

12. The method as claimed in claim 11, wherein the barrier layer is Ti/TiN or TiW formed by sputtering.

* * * * *